United States Patent Office 3,244,569
Patented Apr. 5, 1966

3,244,569
ETCHED LETTERPRESS PLATE AND PROCESS OF PREPARING SAME

Donald L. Fauser, Lakewood, Robert H. Sturik, Garfield Heights, and Dolor N. Adams, Cleveland Heights, Ohio, assignors to Harris-Intertype Corporation, Cleveland, Ohio, a corporation of Delaware No Drawing. Filed Dec. 29, 1961, Ser. No. 163,048
15 Claims. (Cl. 156—13)

The present invention relates to a chemically etched letterpress printing plate and, more particularly, to an improved process of preparing such a plate.

For many years the conventional method of making a relief printing surface, such as a photoengraving, by chemical etching methods involved the photographic preparation of an acid resist, followed by a series of etching steps, each of which resulted in the removal of only a small amount of metal. Each etching step after the first was preceded by a so called "powdering" and "burning in" step by which protective material was applied to the side walls of the etched portions so as to prevent a lateral etching or undercutting of the relief areas. This procedure was obviously time consuming and furthermore was not reliable as to reproducibility.

In more recent years, efforts have been made with success to develop processes whereby the necessary depth of etching may be achieved in one etching step. Such procedures involve the use of special etching materials employing banking agents which prevent etching of the side walls of the relief areas. The patents hereinafter referred to, assigned to The Dow Chemical Company, describe procedures designed to accomplish such one-bite etching. The process embodying such procedures is known in the art and herein referred to as the Dow Etch Process.

The process disclosed in these patents generally involves the following steps:

(1) The metal plate is brushed with pumice and water to impart a grain, the excess pumice being flushed or rubbed away.

(2) A photosensitive coat is applied over the grained plate, such as known "cold-top" enamel employing shellac.

(3) The dried coated plate is exposed to light through a negative and developed to produce a hardened resist image which is then dried or "burned in" over a gas flame.

(4) A shallow etch or first "bite" is taken with dilute nitric acid, as in a crockery splash machine, to a depth of approximately 0.001 inch.

(5) The plate is protected until the etching step by treatment with dilute sulphuric acid or gum arabic solution.

(6) The plate is then etched with a nitric acid solution involving other materials including the banking agent referred to.

Etched letterpress plates prepared by such techniques suffer from several shortcomings. It is, for example, difficult to obtain reproducible results. Moreover, there is a breakdown in fidelity of reproduction in the range of half-tones in which the relief areas comprise about 40 percent to 60 percent of the total area. In addition there is a limitation in the number of lines per inch which can be satisfactorily reproduced by such methods in half-tone work.

A further disadvantage is that the above process is not satisfactory for the production of combined half-tone and line work on the same plate. The process when adjusted to produce the best half-tone plate is not satisfactory for the simultaneous production of line work, and vice versa.

The reasons for these difficulties are mainly too much undercutting of the image areas or an inability to control the amount of undercutting. In accordance with the present invention, appreciably less undercutting and a better control on the etching step result. For example, under comparative tests an etch factor (ratio of depth of etch to undercut or lateral etch) of a maximum of 10 was obtained using the Dow Etch Process; whereas an etch factor in excess of 20 was realized with the present method.

According to this invention, undercutting is minimized and etching control and other advantages are realized by the procedures and materials employed. In particular, the present advantages are obtained by:

A. Omitting the graining step, that is, cleaning the plate without graining it.

B. Using a mild scum-out.

C. Using a protective covering on the plate prior to etching consisting essentially of a water-soluble non-emulsifying polysaccharide.

It is, therefore, a principal object of the present invention to provide an improved etched letterpress plate and a process of preparing it.

Another object is to provide such a process capable of providing reproducible results by a single etching step and without the use of hand correction methods.

A further object is to provide a process for preparing an etched letterpress plate in which undercutting of the relief areas is reduced.

A still further object is to provide a process for preparing an etched letterpress plate having better control of the etching step.

A still further object is to provide an improved Dow Etch Process.

A still further object is to provide such a process that results in high quality plates of excellent definition and resolution, including plates capable of printing 120 line screen half-tones or better with essentially no distortion in tone values, including the transition range from about 40 percent to about 60 percent.

A still further object is to provide a process of preparing an etched wrap-around letterpress plate, that is, a plate having numerous subjects on a single relatively thin sheet of metal.

A still further object is to provide a process of preparing an improved etched letterpress plate containing both line and half-tone work with the use of a single etching bath and uninterrupted etching operation.

Other objects will become apparent as the description proceeds.

To the accomplishment of the foregoing and related ends, the invention consists of the features hereinafter fully described and particularly pointed out in the claims, the following disclosure describing in detail the invention, such disclosure illustrating, however, but one or more of the various ways in which the invention may be practiced.

In developing the present process and plate, it is important to note that each step of the process was derived after extended research and development, for each step must not only accomplish its intended purpose but be compatible with the operation and purposes of the remaining steps, thus producing a truly synergistic effect. The optimum results are obtained upon using together in combination the improved steps of the process described.

While the present process may be used for the preparation of separate printing plates for individual subjects and these plates may be of different thickness for securing to a press cylinder or bed by the usual compression lock-up devices, this process has particular usefulness in connection with the preparation of flexible printing plates carrying several subjects and secured to a printer roller of a rotary press by tensioning devices at the ends of the plate. The advantages of such plates in reduction of make-ready time are well known, but heretofore no single technique of preparation and etching has been satisfactory for different subjects on the same plate. The present process, which overcomes this difficulty, has therefore special utility in the preparation of thin, flexible, multi-subject plates.

In general, we have found three steps of the process to be of especial importance if high quality etched plates are to be obtained: namely, cleaning a metal plate prior to application of a single type of photosensitive layer by treating the plate with a mixture of a grease-dissolving, water-soluble organic solvent and an acid of insufficient strength substantially to attack the metal plate; activating non-image areas of the plate after exposure and development by treating the plate with an acidified aqueous solution or brine of a water-soluble chloride salt capable of being hydrated in aqueous solution; and protecting the plate prior to the etching with nitric acid with a coat of a non-emulsifying and non-reactive water-soluble polysaccharide resistant to nitric acid.

The following steps are exemplary of our process:

A. A sheet or plate of metal selected from the group consisting of zinc and magnesium and having a thickness from about 0.025 inch to about 0.032 inch is cleaned by treatment with a mixture of a grease-dissolving, water-soluble solvent and an acid, preferably a relatively weak aliphatic water-soluble carboxylic acid, of insufficient strength substantially to attack the metal plate.

B. A layer of dichromated polyvinyl alcohol is applied over and dried onto the cleaned plate to serve as a photosensitive layer or coating.

C. The plate is exposed to light through a stencil or photographic negative to harden selected areas.

D. The plate is developed to remove the layer in the unhardened areas and form a resist or image pattern composed of the light exposed photosensitive material.

E. The image pattern is "fixed" or made etch resistant.

F. The uncovered areas of the metal plate are then activated by treatment with an acidified aqueous solution of a water-soluble chloride salt capable of being hydrated in aqueous solution.

G. The areas that are activated are protected with a layer of a non-emulsifying, non-reactive, water-soluble polysaccharide resistant to nitric acid.

H. The plate is finally etched with a nitric acid solution, such as the various Dow etching solutions.

Discussing these steps in somewhat greater detail, the metal plate may include as well alloys of either magnesium or zinc. For example, one magnesium-based alloy that may be used consists of 3 percent aluminum, 1 percent zinc, and 0.2 percent manganese, the balance being magnesium. Similiarly, zinc-based alloys containing 95 percent or more of zinc may be used as practiced in the art. It will be noted that the sheet is relatively thin, especially as compared to prior letterpress plates. This gauge of metal is well suited to a "wrap-around" type of plate, that is, one that can be easily flexed around and fastened to a printing roller. Furthermore, in view of the improved process control possible with the present process, use of such a relatively thin plate is permissible.

As a metal plate is received from a manufacturer, its surface repels water due principally to the presence of oil and the like from the rolling mills. The surface must be made water-receptive. However, cleaning a plate by brushing with pumice and water has been found so to scar the plate with hills and valleys that poor fidelity in the final etched plate results. Instead, we employ a cleaner consisting of a mixture of a water-soluble, organic solvent and acid as indicated. The water-soluble, organic solvent removes the grease and like oils. By the term "water-soluble, organic" is meant that type of solvent exemplified by methyl Cellosolve (ethylene glycol mono-methyl ether), ethyl Cellosolve, butyl Cellosolve, acetone, carbitol, butyl carbitol, carbitol acetate, that is, $C_2H_5(OC_2H_4)_2OCOCH_3$ methyl ethyl ketone, diacetone alcohol, and the like. The acid used with the organic solvent also serves to clean the plate and help cut any grease coating. Almost any acid can be used for this purpose, as long as the acid does not substantially attack the metal of the plate. Accordingly, acids like dilute phosphoric can be employed. However, it is preferred to use relatively mild or weak acids such as aliphatic water-soluble carboxylic acids. Lactic acid is recommended.

A smooth plate employed in the process of this invention, as contrasted with a grained plate, is found to be highly beneficial, since such a plate permits sharper dot edges on the half-tone images. A smooth plate also makes possible a milder scum-out action, since the scum is formed on a smooth surface instead of being lodged in depressions of a roughened surface.

The use of wetting agents facilitates the action of the components of the cleaner. However, non-ionic wetting agents are preferred. Anionic and cationic wetting agents less easily provide the results desired. There is an apparent surface adsorption with resulting plating out of the material. Examples of non-ionic wetting agents that can be used include sorbitan monolaurate, sorbitan monostearate, polyethylene glycol tertiary dodecyl thio-ether, polyoxyethylene sorbitant monolaurate, and polyoxyethylene-ether, the latter being sold under the trade name Sterox AG.

After the metal sheet has been cleaned and thoroughly water rinsed, the photosensitive film is applied. In general, photosensitive materials which are satisfactory for use in the Dow Etch Process are suitable in relation to the herein described steps of the present improved process. A preferred photosensitive material, which is commonly used, is dichromated polyvinyl alcohol. Other photosensitive materials that may also be used include dichromated fish glue; dichromated shellac; photosensitive esters of cinnamic acid which are known in the art, for example, such as those disclosed in U.S. Patent No. 2,610,120 and those described in the article "Photosensitive Polymers," which appears in the Journal of Applied Polymer Science, vol. II, issue No. 6, 1959, pages 302 to 311, both of such citations being hereby incorporated by reference; and diazo-sensitized polyvinyl alcohol. Similarly, the diazo materials suitable for sensitizing polyvinyl alcohol are known in the art and may be those such as are disclosed in U.S. Patent No. 2,667,415. The preparation of a very satisfactory diazo compound for the purpose indicated is described in U.S. Patents No. 2,679,498 and No. 2,063,631. This compound is a condensation product of paraformaldehyde with p-diazodiphenylamine sulfate. These three cited patents are also hereby incorporated by reference.

For best results, the solids content of a dichromated polyvinyl alcohol dispersion used as the photosensitive material for the plate should be from about 6 percent to about 14 percent. As is known in the art, polyvinyl alcohol includes a family of polymers having varying degrees of polymerization and varying saponification numbers. Thus, polyvinyl alcohol dispersions usable in the present invention may have a relatively low degree of polymerization as indicated by a viscosity of a 4 percent dispersion in water from 4 to 6 centipoises to a relatively high degree of polymerization as indicated by a viscosity of 4 percent water dispersion of from 35 to 55 centipoises. This range, however, is not critical. Exposure of the plate is carried out in a conventional manner as by subjecting the plate to light through a stencil or negative from a carbon arc. The plate is then flushed with a developing solution such as water to wash away the unexposed areas of the dichromated polyvinyl alcohol and form an image pattern composed of the exposed photosensitive material.

The image pattern areas are now chemically "fixed" in a known manner. The plate is treated with a solution of a dye to color the resist areas for visual inspection and subsequent chemical reaction with the chromic acid. The developing dye or agent may be an aromatic dye having in its molecular structure a polyhydroxy aromatic ring. Examples of dyes usable in the present invention include logwood, hematine, hematoxylin, quercitrin, catechin, fustin, and hypernic. Also, tannic acid and rhodamine B can be used. The amount of developing dye should be at least about 0.1 percent by weight of the solution up to approximately 6 percent. If desired, the developing dye may be incorporated in the developing water wash as has been customary in the past.

The plate is next treated by "pour-over" or dipping with an aqueous solution of chromic acid. For example, a plate may be dipped in a 2 percent to 4 percent aqueous solution of chromic acid for about 20 seconds to about two minutes. The plate is next hardened and toughened to form a satisfactory Dow bath or acid resist by being heated to a temperature within the range of about 300° F. to about 460° F. It is necessary only to heat the plate to a temperature within the range indicated without maintaining that temperature for any prolonged period of time. The resulting polyvinyl alcohol resist on the plate is hydrophobic, firmly adhered to the metal sheet, and resistant to etching acids. The hardened resist areas are reaction products of the tanned polyvinyl alcohol, the chromic acid, and possibly also the dye. Increased chromium content of the resist areas can accordingly be realized and the areas become harder and denser. During heating the resist areas acquire a chocolate brown to light black color which can be used as an indication of the end point for the heating step without employing temperature-indicating sticks or crayons.

Following the hardening or chemical fixing of the resist areas, the bare metal or non-image areas left uncovered are activated in preparation for the etching operation. Also, a slight amount of the dichromated polyvinyl alcohol or other photosenstitive material may be left in some plate areas by an incomplete developing wash. Such polyvinyl alcohol is now readily visible as a surface scum since it is colored by the fixing operation. Our activating step removes this scum while not substantially undercutting the resist areas. During the scum out step of the Dow Etch Process as heretofore practiced, there is an undercut of at least about 0.0005 inch and normally the undercut can be as high as 0.001 inch. It is noted that the "scumming out" operation of most photoengravers includes a first bite of 0.001 inch depth which gives more side-etch or undercut of the resist than is shown by our completed plate.

For our activating step we use an acidified viscous aqueous solution comprising an acid capable of attacking the metal of the plate and a compatable viscous carrier medium which is non-reactive to the metal of the plate. Obviously, many acids, both organic and inorganic, may be used for the purpose of "eating" or attacking the metal. Such solution is distributed over the plate with pressure and motion as my rubbing to bring the acid portion of the solution into contact with the plate surface to provide a controlled mild etching action. In the absence of rubbing, a slight and generally insufficient reaction of the acid and metal takes place due to the limited diffusion of the acid through the viscous medium. The rubbing action brings additional acid to the plate surface, and by controlling the amount of rubbing the amount of etching action can be controlled in accordance with the requirements of different areas of the plate. Such control is especially useful where there are many subjects on a large single plate.

In one such system, the compatible viscous carrier medium is an aqueous solution of a water-soluble chloride salt capable of being hydrated in aqueous solution. Such salts include magnesium chloride, calcium chloride, zinc chloride, and aluminum chloride. Specific examples of such brine solutions, including the acid ingredient, are:

ACTIVATING BRINE 1

| | | |
|---|---|---|
| Tap water | gals | 5 |
| Magnesium chloride | lbs | 100 |
| Hydroxy acetic acid solution (70%) | gals | 0.32 |
| Formic acid (90%) | gals | 0.26 |

ACTIVATING BRINE 2

| | | |
|---|---|---|
| Calcium chloride (40–41° Bé.) | cc | 1000 |
| Hydrochloric acid (37–38.5%) | cc | 20 |

ACTIVATING BRINE 3

| | | |
|---|---|---|
| Calcium chloride (40–41° Bé.) | cc | 1000 |
| Lactic acid (85%) | cc | 53 |

The solution must be acid to attack the metal. The degree of acidity is not critical although quite acid brines are used to effect the treatment quickly. Normally, the acid strength is at a pH of 2 or less. The chloride salts must be capable of being hydrated in aqueous solution in order to form the high salt concentration necessary to provide substantially little free water and a syrup-like viscous solution. For this reason sodium chloride cannot be used. Controlled etching is achieved by reason of the limited diffusion of the acid through the syrup-like brine. This is important in order that the scum-out procedure is controlled primarily by mechanical action and therefore useful on large plates. The syrup-like etch should be rinsed with tap water from the plate prior to the application of a protective coating.

In another activating system, the compatible viscous carrier medium is a water solution of a water-soluble, non-emulsifying, non-reactive polysaccharide material such as starch, or a cellulosic material such as hydroxyethyl cellulose, methyl cellulose and ethyl cellulose. This solution is acidified as in the case of the brines previously mentioned. Also as in the case of the brines, the viscisity of the polysaccharide solution carriers should be such as to provide the desired control of diffusion of the acid therethrough. A preferred acid for use with the polysaccharides is nitric acid, since the latter acid is employed in the etching bath which follows the activating step. It is preferred to use the defined polysaccharide material as the compatible viscous carrier medium, since the application of such material as a subsequent separate step, as hereinafter described, is accordingly eliminated. Also when a brine is used as the compatible viscous carrier medium, there is the possibility that some chloride ions will be carried over to the nitric acid etching solution and form therewith aqua regia to some degree which, of course, is detrimental to the desired operation.

If brine and not the polysaccharide material is used as the compatible viscous carrier medium, immediately following the activating step and prior to etching, the plate is protected by a coat or film applied from water solution of a water-soluble, non-emulsifying, non-reactive polysaccharide material of the type previously described, such as starch and cellulosic materials such as cellulose, methyl cellulose, and ethyl cellulose. Materials usable for this purpose are sold under the trade names Polyose A and Polyose C, produced by Corn Products Co. Another such material is sold under the trade name Excello Dextrum No. 8641. By "non-reactive" is meant that the polysaccharide material does not chemically react with any of the other materials present, such as any emulsifying agent that may be present in the etching bath and does not itself act substantially as an emulsifying agent. The concentration of such materials is not critical but should be such as to provide good working consistency and result in deposit of a thin continuous film when dried. Solutions of about 14°Bé. are satisfactory.

The selection of the material for the protective coat is important since the material must permit the etching operation to take place without fouling the bath. Improved results are possible by using the defined polysaccharide material as a protective plate cover prior to etching in an otherwise conventional process for making an etched plate; that is, this step can be used apart from the other novel steps of the present invention. Although polyvinyl alcohol is excellent for the photosensitizer, it cannot be used as the protective layer, since water-soluble polyvinyl alcohol contaminates the etching bath. The use of gum arabic increases undercutting because it fouls the bath, that is, gum arabic reduces the effectiveness of banking agents and thereby permits undercutting. The protective material should be water-soluble, non-emulsifying, resistant to oxidation by nitric acid, and exhibit adherence as in a film to the metal. The protective material is applied to the plate from an aqueous medium and allowed to dry to form a coat. One reason why a polysaccharide material as herein defined minimizes undercutting is that such material does not contaminate the etching bath or upset the bath chemistry. In addition, it delays initiation of etching because of the time required to dissolve the film, until the bath is in chemical and mechanical equilibrium, thereby providing optimum etching conditions.

As previously indicated, if desired such activating step and the step of applying a protective coating may be combined. For example, if a polysaccharide and nitric acid are used for the activating step (in the absence of any brine) these materials may perform both functions simultaneously rather than requiring successive applications. Also if desired such a solution in preferred concentration for the activating step may be followed by an additional treatment of polysaccharide solution of reduced acid content or without acid to deposit the desired amount of a polysaccharide coat.

The plate is now ready for etching with nitric acid solution which removes the protective covering and attacks the bare metal of the plate. Preferably, the etching is carried out by the Dow method in which the etchant is impinged against the plate in a direction substantially normal thereto. In particular, a multiple paddle etching machine is used whereby in operation the paddles splash the bath against the plate to be etched. The plate is held face down over the paddles. To insure uniform etching, the plate is given a combined rotational and translatory motion.

Since the nitric acid is free to attack the side walls of the image areas as freely as the bare non-image areas, it has been proposed to include an organic film-forming material with the nitric acid solution. The film-forming material produces a removable acid resistant film that exerts a controlling effect on the dissolving action of the acid. The film is formed from the organic film-forming material when the bath is splashed upwardly against the plate. When the force of the bath striking the plate is sufficient to dislodge the film, the nitric acid etches the plate in the non-printing areas. This occurs when the angle of splash is 90° to the plate or approximately so. No etching at the side of the resist areas occurs because the acid strikes these side walls of the resist at a lesser angle. Thus there is insufficient force to dislodge this film. As a result, there is obtained a deeper etch without significant loss in area of the surfaces in relief.

It has been proposed to use various agents, singly or in combination, as the film-former. For example, as disclosed in U.S. Patent No. 2,640,763, which is hereby incorporated by reference, agents which may be added to aqueous nitric acid as film-formers are the relatively insoluble saturated aliphatic acids that are either normally liquid or become liquid at moderately elevated temperatures, such as those having from 5 to 26 carbon atoms, i.e. valeric acid to cerotic acid in the homologous series of saturated aliphatic acids. Effective amounts of the saturated aliphatic acid to use depend upon the concentration of $HNO_3$ in the aqueous nitric acid solution. In general, as the concentration of $HNO_3$ in the nitric acid solution is increased, the amount of saturated aliphatic acid used is to be more or less correspondingly increased. Excessive amounts of the aliphatic acid interfere with the etching action of the nitric acid while too small amounts fail to produce an increase in etch factor. Amounts between these extremes are used. As a quantitative illustration, there may be used from about 0.05 to 4 times as much saturated aliphatic acid as there is $HNO_3$ in the aqueous nitric acid solution.

Also as disclosed in U.S. Patent No. 2,640,764, which is hereby incorporated by reference, a film-former added to aqueous nitric acid may comprise esters of aliphatic acids having from 12 to 18 carbon atoms and polyhydric alcohols having from 2 to 6 carbon atoms, as for example sorbitol laurate, diethylene glycol mono-laurate, diethylene glycol mono-oleate, propylene glycol monolaurate, or glycerol mono-laurate. Effective proportions vary over a wide range and depend upon the concentration of the $HNO_3$ in the diluted nitric acid solution in that the higher the concentration of the $HNO_3$ the greater the amount of ester required. As an example, there may be from about 0.2 to 2.5 times as much ester by weight as the amount of $HNO_3$ in the diluted nitric acid solution.

Further, as disclosed in U.S. Patent No. 2,640,765, which is hereby incorporated by reference, a film-former added to aqueous nitric acid may comprise a wetting agent comprising an ester of sulfosuccinic acid and an aliphatic alcohol having from 4 to 12 carbon atoms. Examples of such esters are: the alkali metal salts such as diisobutyl sodium sulfosuccinate, diamyl sodium sulfosuccinate, dihexyl sodium sulfosuccinate, and dioctyl sodium sulfosuccinate. In addition to the wetting agent, there is added to the bath a water immiscible organic material which is either liquid at ordinary temperatures or liquefies below the temperature at which the etching bath is normally used and is substantially unreactive with the aqueous nitric acid solution. Illustrative of substances suitable for the purpose are the various petroleum fractions boiling in the range of 90° to 390° C., as for example, gasoline, benzine, kerosene, coal oil, and lubricating oils. These liquids are mixtures of various hydrocarbons, mostly saturated, of the paraffin series having from 6 to 18 carbon atoms. Other examples are turpentine, perchloroethylene, and the diethylbenzenes. The amout of wetting agent and water-immiscible liquid to use depends in part upon the concentration of the $HNO_3$ in the nitric acid solution and in part upon the tendency for these additives to reduce the rate of etching of the nitric acid. In general, the wetting agent may be used in an amount ranging from about 0.003 to 0.04 times the weight of the $HNO_3$ in the solution and the water-immiscible liquid may be used in amount ranging from 1 to 14 percent of the weight of the nitric acid solution.

Still further, as disclosed in U.S. Patent No. 2,640,766, which is hereby incorporated by reference, a film-former added to aqueous nitric acid may comprise an ester of sulfosuccinic acid and an aliphatic alcohol having from 4 to 12 carbon atoms. Examples of such esters are: the alkali metal salts; diisobutyl sodium sulfosuccinate, diamyl sodium sulfosuccinate, dihexyl sodium sulfosuccinate and dioctyl sodium sulfosuccinate. The amount of the ester to use depends upon the amount of $HNO_3$ in the nitric acid solution in that the higher the concentration of the $HNO_3$ the greater is the amount of ester required. In general, the ester may be used in an amount which is from 0.0014 to 0.15 times the amount of $HNO_3$ in the nitric acid solution.

Still further, as disclosed in U.S. Patent No. 2,640,767, which is hereby incorporated by reference, a film-former added to aqueous nitric acid may comprise a petroleum sulfonate, e.g. petroleum sulfonic acids having from 18 to 30 carbon atoms, and salts of these acids often referred to as napthenic soaps, or mahogany soaps. The preferred sulfonates have 24 to 26 carbon atoms. The composition of the sodium salts may be expressed by the emperical formula $C_xH_ySO_3Na$, in which $x$ is an integer from 18 to 30 and $y=(2x-10)$. These materials are commercially available usually as mineral oil solutions in which the dissolved petroleum sulfonate comprises about 45 to 65 percent of the mixture by weight, and the balance is substantially all mineral oil. There is used also in the bath a quantity of a petroleum oil fraction boiling in the range of 90° to 390° C. in addition to the mineral oil usually present with the petroleum sulfonate so that the total amount of mineral oil or petroleum fraction in the bath is at least 1.3 times the weight of the petroleum sulfonate but not more than 0.15 of the weight of the nitric acid solution. Examples of such petroleum fractions are gasoline, benzine, kerosene, coal oil, and lubricating oils. These liquids are mixtures of various hydrocarbons, mostly saturated, of the paraffin series having from 6 to 18 carbon atoms. The amount of petroleum sulfonate and petroleum oil fraction to use depends in part upon the concentration of the $HNO_3$ in the nitric acid solution and in part upon the tendency for these additives to reduce the rate of etching of the nitric acid. In general the petroluem sulfonate may be used in an amount ranging from about 0.01 to 0.2 of the weight of the $HNO_3$ in the nitric acid solution.

Still further, as disclosed in U.S. Patent No. 2,763,536, which is hereby incorporated by reference, a film-former added to the aqueous nitric acid may comprise an etching bath including by weight 2 to 14 percent of $HNO_3$, a dioctyl sulfosuccinate in a percentage concentration of at least 0.005 of that of the $HNO_3$ in the bath but not in excess of 0.10 of the percentage of the $HNO_3$, from 2 to 15 percent of diethyl benzene, and a water-dispersible thickening agent selected from the group consisting of the water-soluble gums, gelatin, dextrin, and methyl cellulose, in a percentage by weight of the bath amounting to A times the ratio of the percent of the dioctyl sulfosuccinate to the percent of the $HNO_3$ in the bath, A having the following values: between 0.1 and 1 for the water-soluble gums, between 0.002 and 0.015 for gelatin, between 0.0007 and 0.01 for methyl cellulose, and between 3 and 7 for dextrin.

More recently, it has been discovered that sodium sulfate may be beneficially used in an aqueous solution of the nitric acid. For example, the bath may have the following formula:

12% nitric acid, technical, 42° Bé. by volume
0.7% film-former, by weight, such as dioctyl sodium sulfosuccinate
2.8% diethyl benzene, by volume
0.025% sodium sulfate, anhydrous, by weight
Remainder—water.

In one example enough water was added to make 130 liters. The dioctyl sodium sulfosuccinate is sold under the trade name of Aerosol EG and Monawet MO 70%. In addition to the foregoing gelatin has also been used as a film-former.

In order to obtain more latitude between the undercutting and blanking-off tendencies of the etching bath, the latter is preferably "conditioned" by dissolving magnesium, magnesium oxide, zinc, or zinc oxide in the bath. Dissolution of one of these additives in the bath stabilizes the action of the acid on the plate. The amount added is not critical and may range, for example, from 30 to 40 ounces per 100 liters of the acid bath.

It is preferred to condition the bath with zinc oxide. While the usual practice has been to add the banking agents to the nitric acid solution and then stabilize the bath by etching a piece of zinc with such mixture, a preferred technique has been found to comprise dissolving zinc oxide in the nitric acid solution and thereafter incorporating the banking agents. This manner of stabilizing the bath has been found to be highly contributory to consistent results.

*Example I*

A plate of ground and polished zinc having a thickness of 0.025 inch and free of surface blemishes was sponged with a cleaning solution consisting of a mixture of methyl Cellosolve, lactic acid, and a wetting agent consisting essentially of sorbitan monolaurate. The plate was then rinsed with tap water using the same sponge to swab the surface. As a result of this cleaning step there was maintained the original smooth plate surface having essentially no hills and valleys or grained configuration.

With the still wet plate whirling in a conventional horizontal whirler at about 80 revolutions per minute, a solution of dichromated polyvinyl alcohol was poured slowly onto the center of the plate and allowed to coat the entire surface. With the whirler continuing in operation, a bank of infra-red lamps positioned in the whirler adjacent the plate evaporated the solvent and deposited the dichromated polyvinyl alcohol as a photo-sensitive layer or film. The back of the plate was warm to the touch when the coating had reached the desired dry stage.

The plate was next exposed through a negative, a carbon arc providing about 3,000 foot candles at the plate surface being used. The exposure lasted for five minutes. The plate was now washed with warm tap water to remove the unexposed photosensitizer. The plate was then treated with Logwood dye in water to color the image areas. The plate was then dipped for one minute in a 2 percent solution of chromic acid after which the plate was rinsed with tap water and whirled dry in the whirler. The plate was next heated to a temperature of about 450° F. over uniformly distributed gas flames when the resist areas were completely chemically hardened. Following this step the plate image was carefully inspected for scratches, coating imperfections, and the like, which were corrected by the use of a standard stop-out lacquer.

The non-image areas of the plate were now activated by pouring a quantity of Activating Brine 1 onto the surface of the plate and swabbing the brine over the plate with a plush-covered wooden block. After uniform chemical action was established the plate was squeegeed and rinsed with tap water. If a dark smut should result on non-image areas, this may be removed by flushing the plate with a weak solution of nitric acid in water, for example, four ounces of 42° Bé. nitric acid per gallon of water, and the plate again squeegeed and water rinsed. If desired, the plate activating treatment can be repeated once more.

A protective film of a water-soluble methyl cellulose in viscous water solution was then spread over the wet plate with a sponge and fan dried. Finally the plate so prepared was placed in an etching machine, and nitric acid etch containing a film-former as described was impinged against the plate in a direction substantially normal thereto. After the etching operation, the plate was wrapped around a roller of a press for a desired printing operation.

*Example II*

A plate was prepared as in Example I except that in place of Activating Brine 1, an activating solution of the following composition was used:

| | | |
|---|---|---|
| Polysaccharide (Excello Dextrum 8641) | grams | 450–650 |
| Nitric acid (42° Bé.) | cc | 30–50 |
| Water | cc | 1,000 |

After swabbing with this solution until uniform chemical action was established, the plate was squeegeed and then treated with an acid-free solution of Excello Dextrum 8641 of the same concentration as was used in the activating solution. The latter solution was spread over the wet plate with a sponge and fan-dried. Thereafter the plate was etched and placed in position for printing as in Example I.

*Example III*

A plate of zinc was first cleaned with a mixture of ethyl Cellosolve and lactic acid and then rinsed with tap water. With the plate whirling in a conventional horizontal whirler at about 80 revolutions per minute, an alcoholic solution of dichromated shellac was poured slowly over the center of the plate and allowed to coat its entire surface. After drying, the plate was exposed through a negative for about five minutes through a negative to a carbon arc of about 3000 foot candles and subsequently developed by an aqueous solution of methanol containing methyl violet dye to remove the unexposed portions.

After a wash with tap water, the plate was swabbed with cotton and then blotted and fan dried. The plate was heated to about 300° F. for about two minutes to insolubilize by heat the resulting resist. No chromic acid was used in this example. The plate was next treated with a solution consisting essentially of 250 ml. of sulfuric acid (64° Bé.), 25 ml. nitric acid (42° Bé.), 1 teaspoonful of trisodium phosphate, and a sufficient amount of Excello Dextrum 8641 (polysaccharide) and water to make one gallon of solution having 14° Bé.

By means of a swab, this activating solution was uniformly spread over the plate. Ordinarily the amount of polysaccharide so supplied is sufficient to protect the plate prior to etching as previously indicated. However, if desired, it is within the contemplation of the present invention optionally to add additional polysaccharide to ensure that a sufficient quantity is present. In this case additional solution of 14° Bé. Excello Dextrum 8641, and containing no acid, or any of the other indicated ingredients, is applied to the plate. The plate was then fan dried and finally conventionally etched in an etching machine using a Dow bath which may be any of those previously disclosed by the cited patents.

As further examples, plates of magnesium alloy as obtained from Dow Chemical Company under the trade name Zomag were treated as in Examples I through III with good results.

Other forms embodying the features of the invention may be employed, change being made as regards the features herein disclosed, provided those stated by any of the following claims or the equivalent of such features be employed.

We therefore particularly point out and distinctly claim as our invention:

1. In a process of preparing an etched plate wherein an acid resist is formed over a metal plate by exposing a photosensitive layer on the plate to light and developing, the improvement comprising activating the developed plate for etching by applying to such plate an acidified viscous aqueous solution of a non-emulsifying water-soluble polysaccharide, drying said solution on said plate to form a protective film of said polysaccharide on said plate to thus protect the non-image areas thereof during handling and storage prior to final etching and to assure uniform etching of said areas by an etching solution, and subsequently finally etching said plate with an etching solution to form a relief image thereon.

2. In a process of preparing an etched plate, the steps in combination of cleaning a plate of metal selected from the group consisting of zinc and magnesium prior to application of a photosensitive layer adapted to form an acid resist by treating the plate with a mixture of a grease-dissolving water-soluble organic solvent and an acid of insufficient strength substantially to attack the metal plate, activating the plate after exposure and development by applying to the surface of the plate an acidified viscous aqueous solution comprising an acid capable of attacking the metal of the plate and a compatible viscous carrier medium non-reactive with the metal of the plate, and protecting the plate prior to etching by applying to the plate a non-emulsifying water-soluble polysaccharide resistant to nitric acid.

3. In a process of preparing an etched plate, the steps in combination of cleaning a plate of metal selected from the group consisting of zinc and magnesium prior to application of a photosensitive layer adapted to form an acid resist by treating the plate with a mixture of a grease-dissolving water-soluble organic solvent and an acid of insufficient strength substantially to attack the metal plate, activating the plate after exposure and development and prior to any etching step by applying to the surface of the plate an acidified viscous aqueous solution comprising nitric acid and a non-emulsifying water-soluble polysaccharide resistant to nitric acid, said polysaccharide being present in an amount to impart such viscous nature, and then removing excess activating solution and drying.

4. A process as claimed in claim 3 including the further step of applying to the activated surface prepared as defined an aqueous solution of an additional amount of the non-emulsifying water-soluble polysaccharide resistant to nitric acid prior to etching.

5. A process as claimed in claim 3 wherein such acidified viscous aqueous solution also comprises, in addition to nitric acid, sulfuric acid in an amount larger than the amount of such nitric acid.

6. In a process of preparing an etched plate, the steps in combination of cleaning a plate of metal selected from the group consisting of zinc and magnesium prior to application of a photosensitive layer adapted to form an acid resist by treating the plate with a mixture of a grease-dissolving water-soluble organic solvent and an acid of insufficient strength substantially to attack the metal plate, activating the plate for etching, after exposure and development thereof with an acidified aqueous solution of a compatible viscous carrier medium non-reactive with the metal of the plate, and protecting the activated plate prior to etching with nitric acid by applying over such plate a sufficient amount of a non-emulsifying water-soluble polysaccharide resistant to nitric acid to cover those areas to be etched.

7. In a process of preparing an etched plate, the steps in combination of cleaning a plate of metal selected from the group consisting of zinc and magnesium prior to application of a photosensitive layer adapted to form an acid resist by treating the plate with a mixture of a grease-dissolving water-soluble organic solvent and a water-soluble organic acid of insufficient strength substantially to attack the metal plate for etching, activating the plate after exposure and development by treating the plate with an acidified aqueous solution of a compatible viscous carrier medium selected from the group consisting of a non-emulsifying water-soluble polysaccharide and a water-soluble chloride salt capable of being hydrated in aqueous solution, and protecting the activated plate prior to any principal etching step with nitric acid by coating the plate with a non-emulsifying water-soluble polysaccharide material resistant to oxidation by nitric acid.

8. A process of preparing an etched letterpress plate comprising cleaning a sheet of metal selected from the group consisting of zinc and magnesium by cleaning the sheet with a mixture of a grease-dissolving Cellosolve solvent and a water-soluble organic acid of insufficient strength substantially to attack the metal sheet, applying on the cleaned sheet a layer of a photosensitive material selected from the group consisting of dichromated polyvinyl alcohol, dichromated fish glue, dichromated shellac, diazo-sensitized polyvinyl alcohol, and photosensitive esters of cinnamic acid, exposing the plate through a stencil and developing the exposed plate, hardening the remaining image areas to form a resist, activating the uncovered areas of the metal sheet by treatment with an acidified aqueous solution of a compatible viscous carrier medium selected from the group consisting of a non-emulsifying water-soluble polysaccharide and a water-soluble chloride salt capable of being hydrated in aqueous solution, protecting the activated areas of the sheet prior to contact with a principal etchant by coating such areas with a layer of a water-soluble, non-emulsifying, non-reactive polysaccharide selected from the group consisting of starch and cellulosic materials, and then etching the plate so prepared with nitric acid.

9. A process of preparing an etched wrap-around letterpress plate comprising cleaning a sheet of metal selected from the group consisting of zinc and magnesium by washing the sheet with a mixture of a grease-dissolving Cellosolve solvent and a water-soluble organic acid of insufficient strength substantially to attack the metal sheet, coating the washed sheet with a layer of a photosensitive material selected from the group consisting of dichromated polyvinyl alcohol, dichromated fish glue, dichromated shellac, diazo-sensitized polyvinyl alcohol, and photosensitive esters of cinnamic acid, exposing the plate through a negative to harden selected areas of the photosensitive layer, developing the sheet to remove the unhardened areas of the photosensitive material and form a resist, fixing the resist areas by treatment with chromic acid and heating to a temperature sufficient to effect a chemical reaction therebetween, activating the exposed areas of the metal sheet by treatment with an acidified aqueous solution of a water-soluble chloride salt capable of being hydrated in aqueous solution, protecting the activated areas of the sheet prior to etching by coating substantially all of such areas with a layer of a water-soluble non-emulsifying, non-reactive polysaccharide selected from the group consisting of starch and cellulosic materials, and then etching the sheet so prepared in a separate step by impinging nitric acid solution against the sheet in a direction substantially normal thereto, such acid solution containing an organic film-forming material to minimize the etching action on the metal side walls of the resist-protected portions, and removing said protective layer during the course of such etching step.

10. A process of preparing an etched wrap-around letterpress plate adapted for simultaneous preparation of half-tone and line work images comprising cleaning a sheet of metal selected from the group consisting of zinc and magnesium having a thickness from about 0.025 inch to about 0.032 inch by washing the sheet with a mixture of a grease-dissolving Cellosolve solvent and an aliphatic water-soluble carboxylic acid of insufficient strength and activity substantially to attack the metal sheet, coating he washed sheet with a layer of a photosensitizer consisting essentially of dichromated polyvinyl alcohol, exposing the sheet to light through a negative to harden selected areas of the photosensitizer, developing the plate with water to remove the unhardened areas of the photosensitizer and form a resist, chemically fixing the resist areas by treating them with an aqueous solution of a dye and an aqueous solution of chromic acid, heating the resist areas to a temperature sufficient to effect a chemical reaction therebetween, activating the uncovered metallic areas of the metal sheet by treatment with an acidified brine solution of a chloride salt selected from the group consisting of magnesium chloride, calcium chloride, zinc chloride, and aluminum chloride, such solution having an acid strength of at least a pH of 2, protecting the activated metal areas of the sheet by coating substantially all of such areas with a layer of a non-emulsifying non-reactive water-soluble polysaccharide resistant to nitric acid selected from the group consisting of starch and cellulosic materials, and then etching the sheet so prepared with an etchant by impinging nitric acid solution against the sheet in a direction substantially normal thereto, such acid solution containing an organic film-forming material to minimize cutting on the side walls of the resist-protected portions.

11. The process of claim 8 wherein such mixture for cleaning the metal plate comprises methyl Cellosolve and lactic acid in amounts sufficient to remove the grease and like foreign material present, and less than 2 percent by weight of a non-ionic wetting agent.

12. The process of claim 10 wherein such dye is selected from the group consisting of logwood, rhodamine B, hematine, hematoxylin, quercitrin, catechin, fustin, hypernic, and tannic acid, and such heating is conducted at a temperature within a range from about 300° F. to about 460° F.

13. The process of claim 8 wherein such cellulosic materials are selected from the group consisting of hydroxyethyl cellulose, methyl cellulose, and ethyl cellulose.

14. In a plate adapted for etching comprising a metal base and a resist on the base exposing selected areas of the base for an etching operation; the improvement characterized by a dried protective film of a non-emulsifying water-soluble polysaccharide resistant to but removable by an etchant covering such exposed areas.

15. In a plate adapted for etching comprising a plate of metal selected from the group consisting of zinc and magnesium, and an acid resist covering the plate exposing selected areas of the plate for an etching operation; the improvement characterized by a dried protective layer covering said exposed areas consisting essentially of a non-emulsifying water-soluble polysaccharide resistant to but removable by the etchant.

References Cited by the Examiner

UNITED STATES PATENTS

| | | | |
|---|---|---|---|
| 2,043,905 | 6/1936 | Seymour | 96—36 |
| 2,763,536 | 9/1956 | Easley et al. | 156—14 |
| 2,979,387 | 4/1961 | Easley et al. | 156—14 |
| 3,023,138 | 2/1962 | Easley et al. | 156—14 |

JACOB H. STEINBERG, *Primary Examiner.*

HAROLD ANSHER, ALEXANDER WYMAN, *Examiners.*